(12) United States Patent
Tseng et al.

(10) Patent No.: US 8,778,215 B2
(45) Date of Patent: Jul. 15, 2014

(54) THERMOELECTRIC COMPOSITE MATERIAL

(75) Inventors: Shih-Chun Tseng, Hsinchu (TW);
Wen-Hsuan Chao, Miaoli County (TW); Hsu-Shen Chu, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 147 days.

(21) Appl. No.: 13/463,792

(22) Filed: May 3, 2012

(65) Prior Publication Data

US 2013/0153819 A1 Jun. 20, 2013

(30) Foreign Application Priority Data

Dec. 19, 2011 (TW) .............................. 100147054 A

(51) Int. Cl.
*H01L 35/22* (2006.01)

(52) U.S. Cl.
USPC .................... 252/62.3 T; 136/236.1; 977/799; 977/782; 977/784; 977/833

(58) Field of Classification Search
USPC ........... 252/62.3 T; 136/236.1; 977/799, 782, 977/784, 833
See application file for complete search history.

(56) References Cited

U.S. PATENT DOCUMENTS

| | | | |
|---|---|---|---|
| 319,745 A | 6/1885 | Fils | |
| 319,750 A | 6/1885 | Sexton | |
| 6,882,051 B2 | 4/2005 | Majumdar et al. | |
| 6,996,147 B2 | 2/2006 | Majumdar et al. | |
| 7,129,554 B2 | 10/2006 | Lieber et al. | |
| 7,211,464 B2 | 5/2007 | Lieber et al. | |
| 7,254,151 B2 | 8/2007 | Lieber et al. | |
| 7,256,466 B2 | 8/2007 | Lieber et al. | |
| 7,301,199 B2 | 11/2007 | Lieber et al. | |
| 7,309,830 B2 * | 12/2007 | Zhang et al. ............... | 136/236.1 |
| 7,385,267 B2 | 6/2008 | Lieber et al. | |
| 7,569,847 B2 | 8/2009 | Majumdar et al. | |
| 7,569,941 B2 | 8/2009 | Majumdar et al. | |
| 7,595,260 B2 | 9/2009 | Lieber et al. | |
| 7,619,290 B2 | 11/2009 | Lieber et al. | |
| 8,535,554 B2 * | 9/2013 | Rowe et al. ............... | 252/62.3 T |
| 8,568,607 B2 * | 10/2013 | Rowe ........................ | 252/62.3 T |
| 2002/0172820 A1 | 11/2002 | Majumdar et al. | |
| 2002/0175408 A1 | 11/2002 | Majumdar et al. | |
| 2005/0161662 A1 | 7/2005 | Majumdar et al. | |
| 2007/0082200 A1 | 4/2007 | Gruen | |

(Continued)

FOREIGN PATENT DOCUMENTS

TW 201032365 9/2010

OTHER PUBLICATIONS

Himanshu Mishra et al., "Thermomechanical and Thermal Contact Characteristics of Bismuth Telluride Films Electrodeposited on Carbon Nanotube Arrays," Advanced Materials, 2009, pp. 4280-4283, vol. 21, Wiley, US.

Choongho Yu et al., "Thermoelectric Behavior of Segregated-Network Polymer Nanocomposites," Nano Letters, 2008, pp. 4428-4432, vol. 8, No. 12, American Chemical Society, US.

J. K. Lee et al., "Control of Thermoelectric Properties Through the Addition of Ag in the $Bi_{0.5}Sb_{1.5}Te_3$ Alloy," Electronic Materials Letters, 2010, pp. 201-207, vol. 6, Issue 4, Mendeley, US.

(Continued)

*Primary Examiner* — Carol M Koslow

(57) ABSTRACT

An embodiment of the present disclosure provides a thermoelectric composite material including: a thermoelectric matrix including a thermoelectric material; and a plurality of nano-carbon material units located in the thermoelectric matrix and spaced apart from each other, wherein a spacing between two neighboring nano-carbon material unit is about 50 nm to 2 µm.

15 Claims, 17 Drawing Sheets

(56) References Cited

U.S. PATENT DOCUMENTS

| | | |
|---|---|---|
| 2007/0137684 A1 | 6/2007 | Gruen |
| 2007/0164270 A1 | 7/2007 | Majumdar et al. |
| 2008/0092938 A1 | 4/2008 | Majumdar et al. |
| 2008/0236804 A1 | 10/2008 | Cola et al. |
| 2009/0044848 A1 | 2/2009 | Lashmore et al. |
| 2010/0108115 A1* | 5/2010 | Lee et al. .................. 136/236.1 |
| 2010/0319750 A1 | 12/2010 | Meng et al. |
| 2011/0284804 A1* | 11/2011 | Kim et al. .................... 252/503 |

OTHER PUBLICATIONS

Marcus Scheele et al., "Synthesis and Thermoelectric Characterization of $Bi_2Te_3$ Nanoparticles," Advanced Functional Materials, 2009, pp. 3476-3483, vol. 19, Wiley, US.

Ming-Shan Jeng et al., "Modeling the Thermal Conductivity and Phonon Transport in Nanoparticle Composites Using Monte Carlo Simulation," Journal of Heat Transfer, Apr. 2008, pp. 042410-1-042410-11, vol. 130, ASME, US.

* cited by examiner

THERMOELECTRIC COMPOSITE MATERIAL

CROSS REFERENCE TO RELATED APPLICATIONS

This application claims priority of Taiwan Patent Application No. 100147054, filed on Dec. 19, 2011, the entirety of which is incorporated by reference herein.

BACKGROUND OF THE DISCLOSURE

1. Field of the Disclosure

The present disclosure relates to a thermoelectric material, and in particular relates to a composite material including a thermoelectric material and a carbon material.

2. Description of the Related Art

Thermoelectric power generation is a power generation means by converting thermal energy into electric energy, utilizing Seebeck effect by which thermal electromotive force is generated by applying a temperature difference between thermoelectric conversion materials. Thermoelectric power generation is eco-friendly since it is capable of utilizing geotherm or exhaust heat such as heat from incinerators as a thermal energy.

The efficiency of converting thermal energy into electric energy of the thermoelectric conversion material (hereinafter, referred to as "energy conversion efficiency") depends on the ZT value (ZT) of the thermoelectric conversion material. The ZT value (ZT) is determined by equation (1) according to the Seebeck coefficient ($\alpha$, also referred to as "thermoelectric coefficient"), electric conductivity ($\sigma$) and thermal conductivity ($\kappa$) of the thermoelectric conversion material.

$$ZT = \alpha^2 \times \sigma \times T / \kappa \quad (1)$$

If a thermoelectric conversion material having a large ZT value (ZT) is used, a thermoelectric conversion device of excellent energy conversion efficiency is obtained. Thus, the manufacturing method of the thermoelectric conversion material having a large ZT value (ZT) is needed.

BRIEF SUMMARY OF THE DISCLOSURE

An embodiment of the disclosure provides a thermoelectric composite material which includes: a thermoelectric matrix comprising a thermoelectric material; and a plurality of nano-carbon material units located in the thermoelectric matrix and spaced apart from each other, wherein a spacing between two neighboring nano-carbon material units of the nano-carbon material units is about 50 nm to 2 μm.

A detailed description is given in the following embodiments with reference to the accompanying drawings.

BRIEF DESCRIPTION OF THE DRAWINGS

The present disclosure can be more fully understood by reading the subsequent detailed description and examples with references made to the accompanying drawings, wherein.

DETAILED DESCRIPTION OF THE DISCLOSURE

The following description is of the best-contemplated mode of carrying out the disclosure. This description is made for the purpose of illustrating the general principles of the disclosure and should not be taken in a limiting sense. The scope of the disclosure is best determined by reference to the appended claims.

It is understood, that the following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer, include embodiments where the first and second layers are in direct contact and those where one or more layers are interposing the first and second layers.

Figure 1:
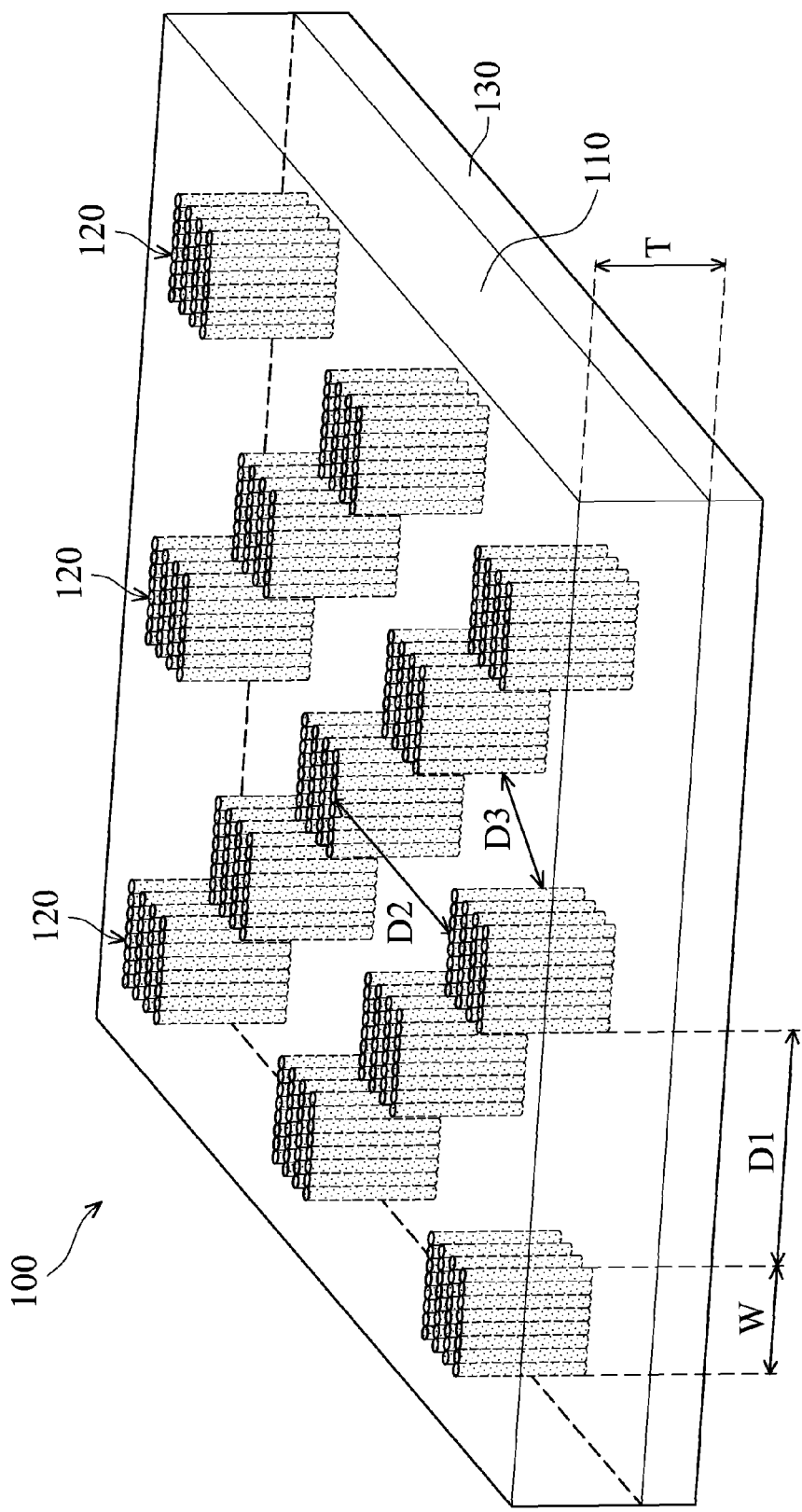
FIG. 1 is a perspective view showing a thermoelectric composite material according to an embodiment of the present disclosure.

FIG. 1 is a perspective view showing a thermoelectric composite material according to an embodiment of the present disclosure. Referring to FIG. 1, a thermoelectric composite material 100 of the embodiment includes a thermoelectric matrix 110 and a plurality of nano-carbon material units 120, wherein the material of the thermoelectric matrix 110 includes a thermoelectric material such as bismuth telluride, antimony-doped bismuth telluride, selenium-doped bismuth telluride, zinc antimonide, half-Heusler alloys, combinations thereof, or other suitable thermoelectric materials. In one embodiment, a thickness T of the thermoelectric matrix 110 is about 2.5 μm to 3 μm.

Nano-carbon material units 120 are located in the thermoelectric matrix 110 and spaced apart from each other. A spacing between two neighboring nano-carbon material units 120 may be about 50 nm to 2 μm such as about 200 nm to 1 μm. In one embodiment, the spacing may be about 400 nm to 700 nm. The spacing may be, for example, 400 nm to 500 nm. The term "spacing" here means a spacing between two neighboring nano-carbon material units 120 in any direction, such as the spacing D1, D2, or D3. The spacings D1, D2, and D3 may be all about 50 nm to 2 μm. Alternatively, only one of the spacings D1, D2, and D3 is about 50 nm to 2 μm.

The material of nano-carbon material units 120 may include carbon nanotube, graphite, graphene, or another carbon material having good conductivity. In one embodiment, a width W of each of the nano-carbon material units 120 is about 100 nm to 1 μm. In one embodiment, the width W of each of the nano-carbon material units 120 substantially equals to the spacing between two neighboring nano-carbon material units 120, such as the spacing D1, D2, or D3. In one embodiment, both the width W of each of the nano-carbon material units 120 and the spacing D1 between the two neighboring nano-carbon material units 120 may be 500 nm.

Specifically, in the embodiment, the spacing between (two neighboring) nano-carbon material units 120 is set to be smaller than a mean free path of phonon in the thermoelectric matrix 110. Thus, the probability of scattering of phonon due to collision between phonon and the nano-carbon material units 120 in the thermoelectric matrix 110 may be increased such that transmission of phonon in the thermoelectric matrix 110 is obstructed. Therefore, thermal conductivity (κ) of the thermoelectric composite material 100 may be reduced such that the ZT value of the thermoelectric composite material 100 is increased. In one embodiment, when the material of the nano-carbon material units 120 is carbon nanotube and the material of the thermoelectric matrix 110 is antimony-doped bismuth telluride (BiSbTe), the thermoelectric composite material 100 has a thermal conductivity (κ) of about 0.68 W/mK at room temperature (300K).

Further, because the nano-carbon material units 120 are spaced apart from each other in the thermoelectric matrix 110 to form a nanostructure array, the Seebeck coefficient (α) of the thermoelectric composite material may be significantly increased. The nano-carbon material units 120 have excellent physical properties (such as a good conductivity) such that the Seebeck coefficient (α) and conductivity (σ) of the thermoelectric composite material 100 may be significantly increased. Thus, the ZT value of the thermoelectric composite material 100 is significantly increased. In one embodiment, when the material of the nano-carbon material units 120 is carbon nanotube and the material of the thermoelectric matrix 110 is antimony-doped bismuth telluride ($Bi_{0.4}Sb_{1.6}Te_3$), the thermoelectric composite material 100 has a Seebeck coefficient (α) of about 500 μV/K at room temperature (300K).

In one embodiment, the thermoelectric matrix 110 may be formed on a substrate 130 and electrically insulated from the substrate 130. The substrate 130 may be a silicon substrate with a silicon oxide layer formed on a surface thereof, quartz substrate, glass substrate, or another substrate suitable for being electrically insulated from the thermoelectric matrix 110 and the nano-carbon material units 120.

FIGS. 2-6 are top views showing thermoelectric composite materials according to embodiments of the present disclosure. The nano-carbon material units 120 may be located in the thermoelectric matrix 110 and optionally arranged in a one-dimensional array (such as that shown in FIG. 5), a two-dimensional array (such as those shown in FIGS. 1, 2, 3, and 4), or a random manner (such as that shown in FIG. 6).

Figure 2:
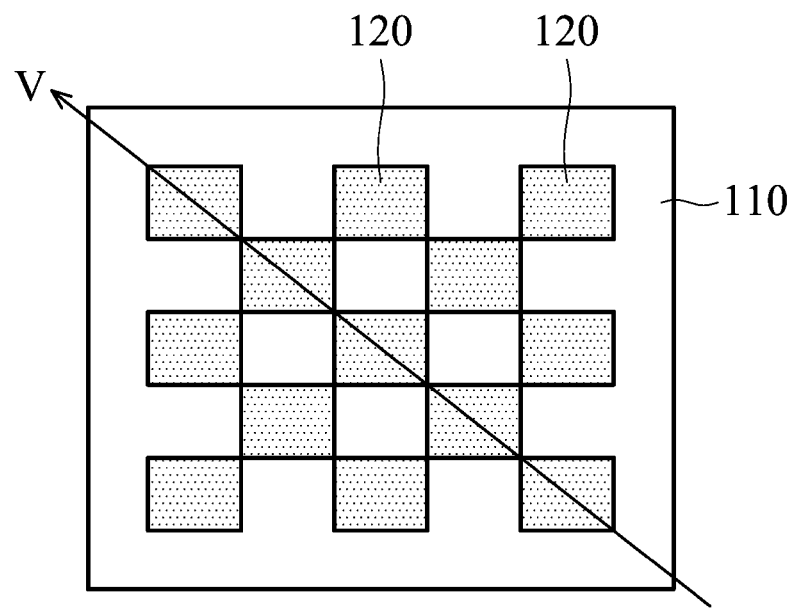
FIGS. 2-6 are top views showing thermoelectric composite materials according to embodiments of the present disclosure.

Specifically, the nano-carbon material units 120 may be arranged as a two-dimensional checker board (such as that shown in FIG. 2) or checker board-like (such as that shown in FIG. 1). In addition, as shown in FIG. 2, the nano-carbon material units 120 located along the diagonal direction V may be in contact (or connect) with each other. The nano-carbon material units 120 may also be arranged as a two-dimensional array (such as that shown in FIG. 3). In another embodiment, the nano-carbon material units 120 may be arranged as a one-dimensional array such as a grid array shown in FIG. 5.

Figure 3:
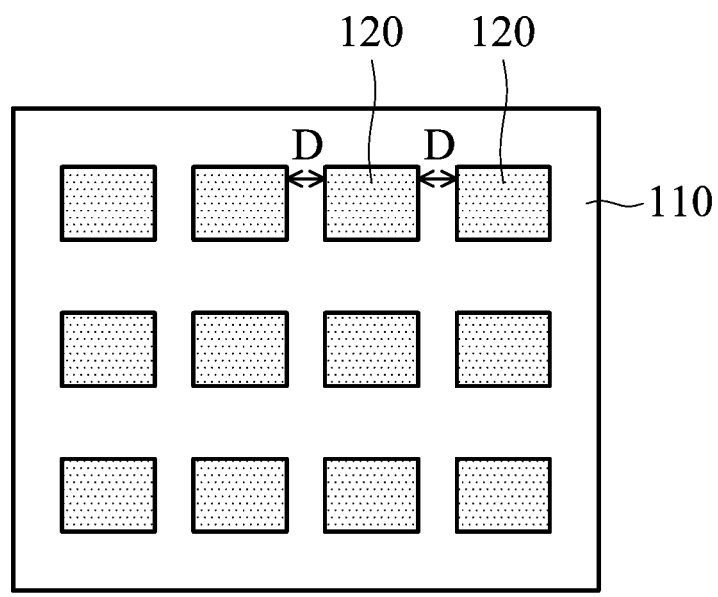
Figure 4:
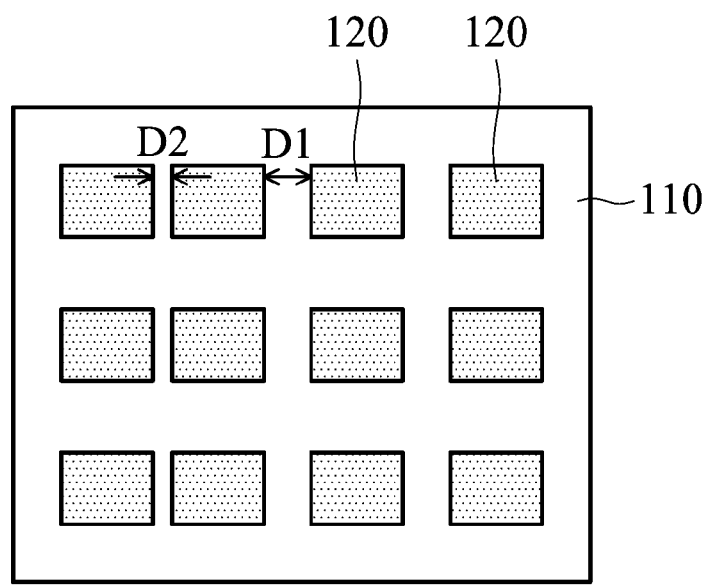
Figure 5:
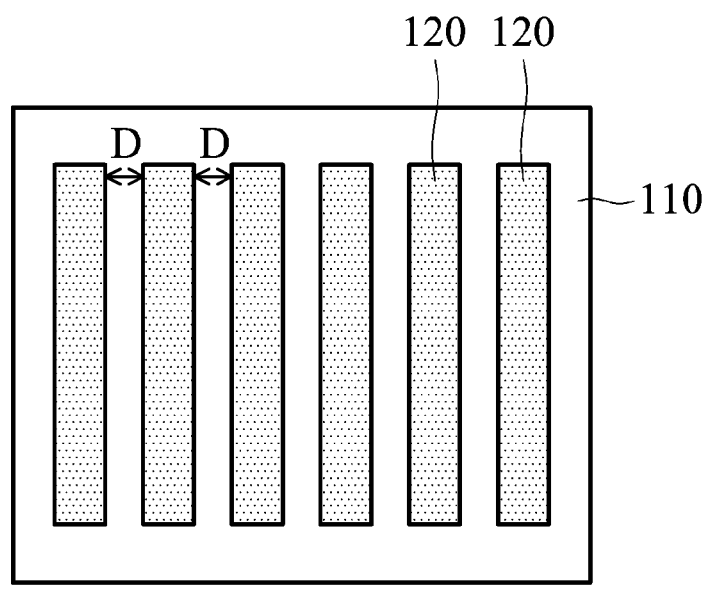
Figure 6:
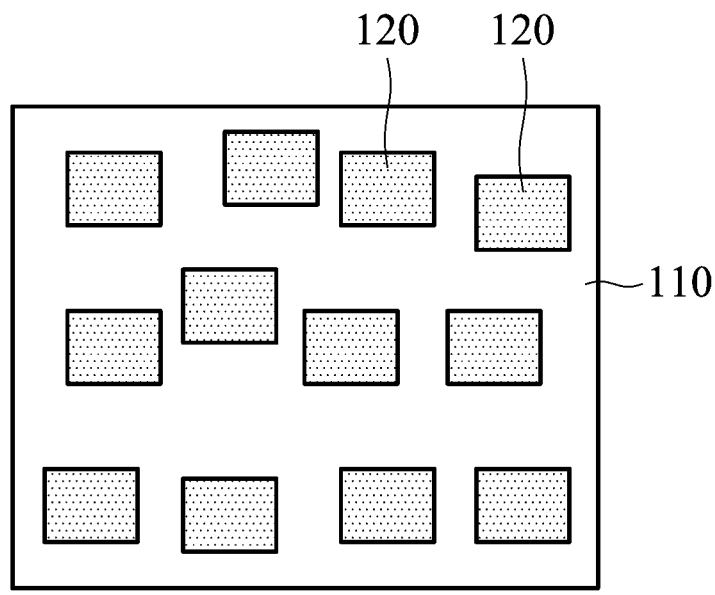

In one embodiment, as shown in FIG. 3 or FIG. 5, the nano-carbon material units 120 in the same row are arranged at equal intervals (wherein the intervals are all the spacing D). In another embodiment, as shown in FIG. 4, the nano-carbon material units 120 arranged in the same row are arranged at different intervals (wherein the spacing D1 does not equal to the spacing D2).

Figure 7:
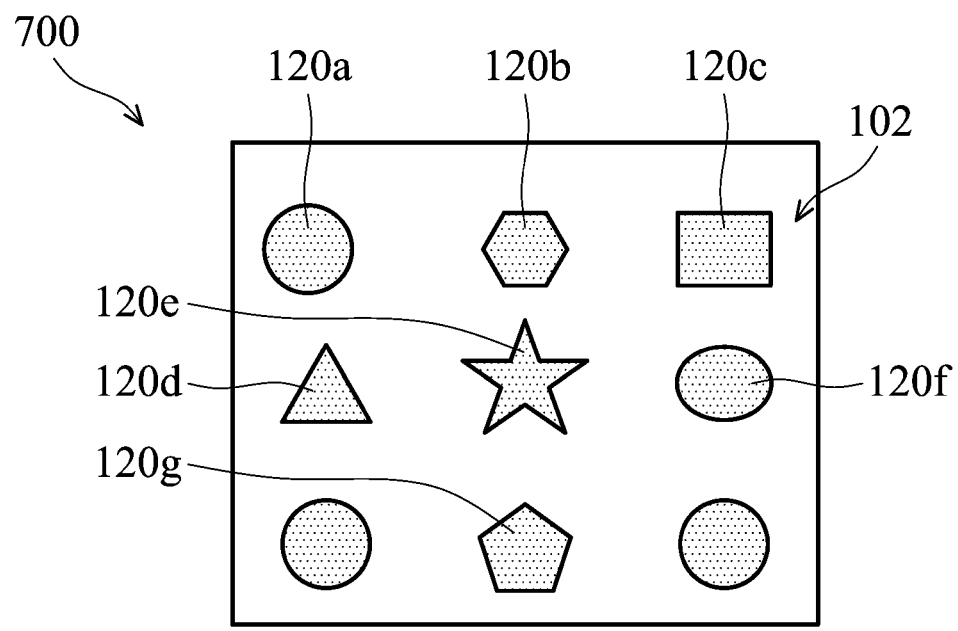
FIG. 7 is a top view showing a thermoelectric composite material according to an embodiment of the present disclosure.

FIG. 7 is a top view showing a thermoelectric composite material according to an embodiment of the present disclosure. Although the nano-carbon material units 120 shown in FIGS. 1-6 all have square cross-sections, cross-sections of different shapes may be employed without departing the spirit of the disclosure. As shown in FIG. 7, a thermoelectric composite material 700 has a main surface 102, and the thermoelectric composite material 700 optionally includes a plurality of nano-carbon material units 120a, 120b, 120c, 120d, 120e, 120f, and 120g. The cross-sectional shapes of the nano-carbon material units along the main surface 102 may be a square shape (the nano-carbon material unit 120c), a circular shape (the nano-carbon material unit 120a), a hexagonal shape (the nano-carbon material unit 120b), an elliptic shape (the nano-carbon material unit 1200, a star shape (the nano-carbon material unit 120e), a triangular shape (the nano-carbon material unit 120d), a pentagonal shape (the nano-carbon material unit 102g) or another polygonal shape.

Figure 8:
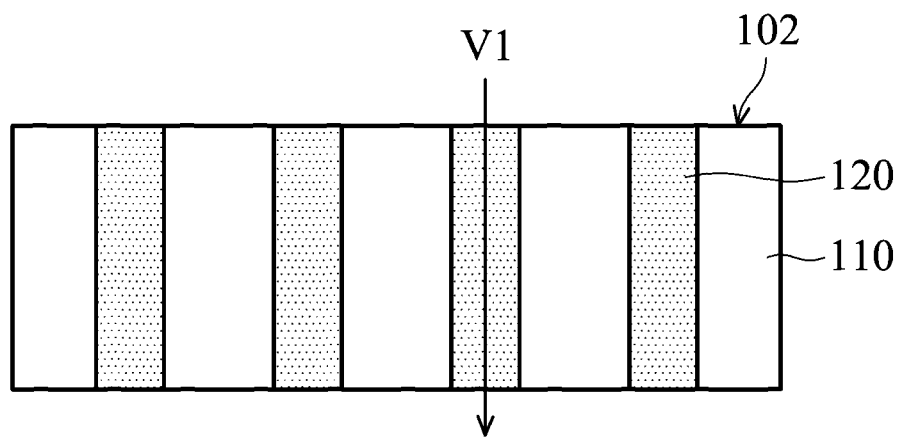
FIGS. 8 and 9 are cross-sectional views showing thermoelectric composite materials according to embodiments of the present disclosure.
Figure 9:
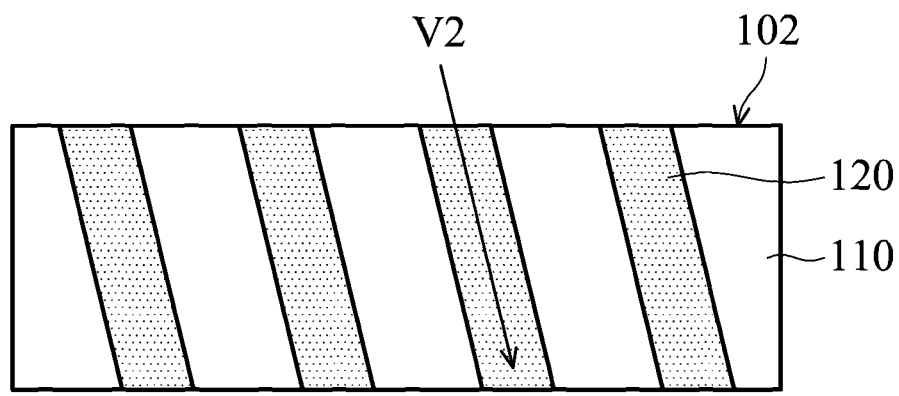

FIGS. 8 and 9 are cross-sectional views showing thermoelectric composite materials according to embodiments of the present disclosure. In one embodiment, as shown in FIGS. 8 and 9, the nano-carbon material units 120 may be in columnar shapes and embedded in the thermoelectric matrix 110 along a single direction. The embedded direction mentioned above may be a direction perpendicular to the main surface 102 (such as the embedded direction V1 shown in FIG. 8) or a direction not perpendicular to the main surface 102 (such as the embedded direction V2 shown in FIG. 9). In addition, the nano-carbon material units 120 may penetrate through (or not completely through) the thermoelectric matrix 110, depending on the actual requirement.

Figure 10:
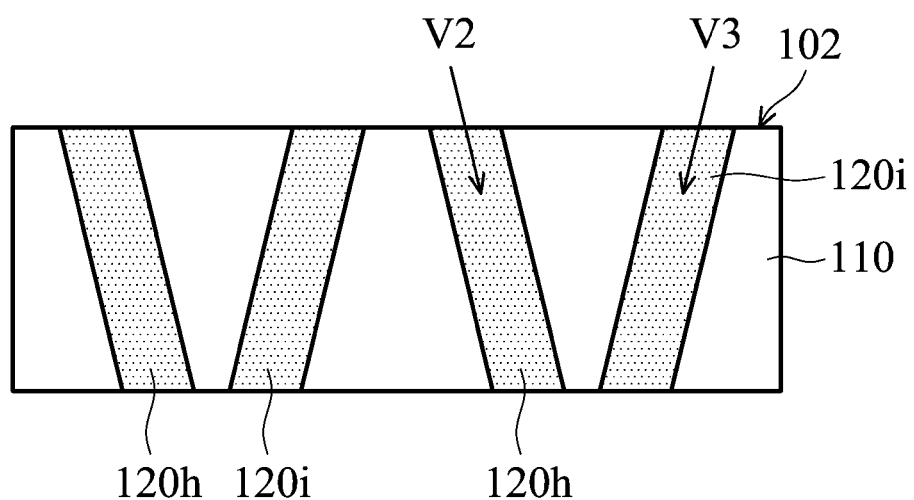
FIG. 10 is a cross-sectional view showing a thermoelectric composite material according to an embodiment of the present disclosure.

FIG. 10 is a cross-sectional view showing a thermoelectric composite material according to an embodiment of the present disclosure. In another embodiment, as shown in FIG. 10, the nano-carbon material units 120h and 120i may be embedded in the thermoelectric matrix 110 along different directions V2 and V3.

Thereafter, two of various methods for forming the thermoelectric composite materials mentioned above are illustrated.

Figure 11A:
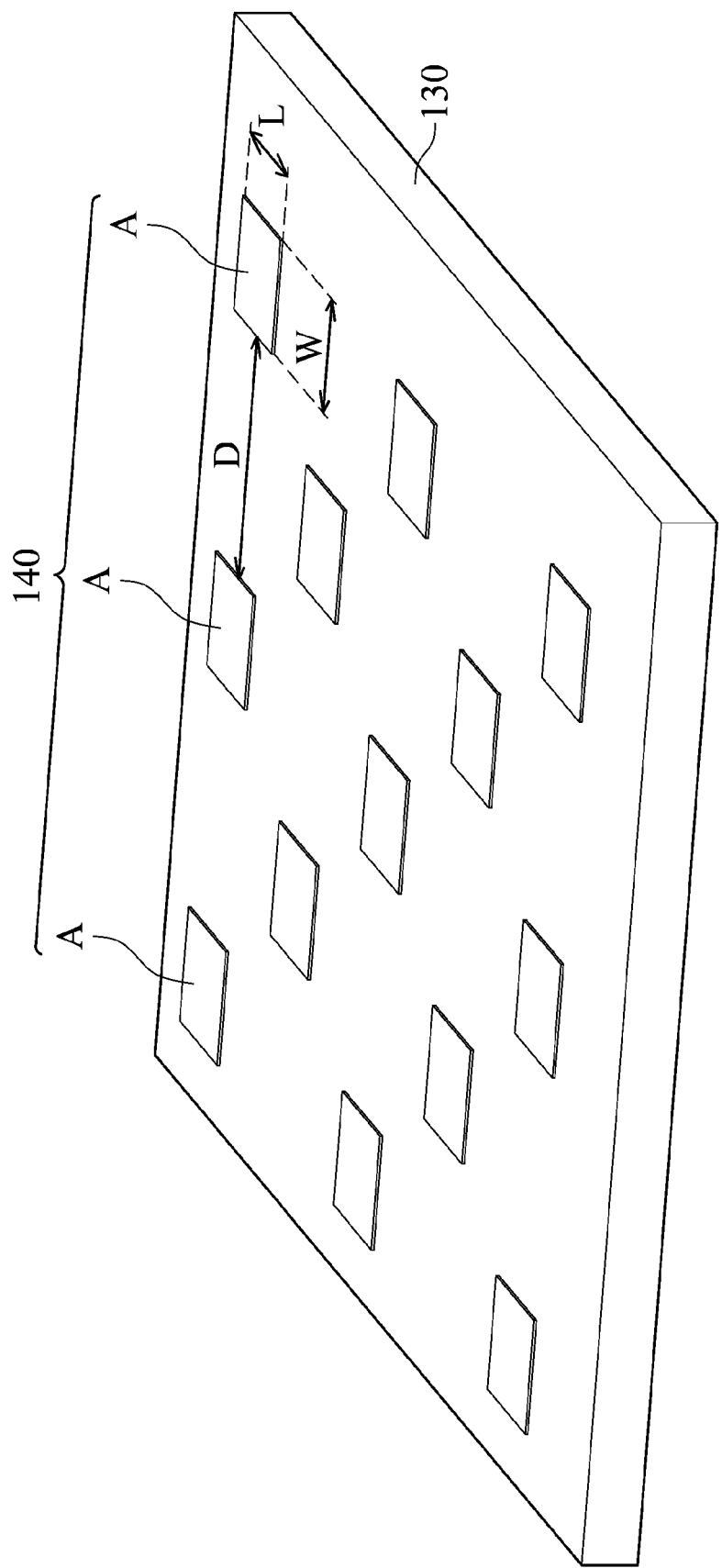
FIGS. 11A-11C are perspective views showing the steps of forming a thermoelectric composite material according to an embodiment of the present disclosure.
Figure 11B:
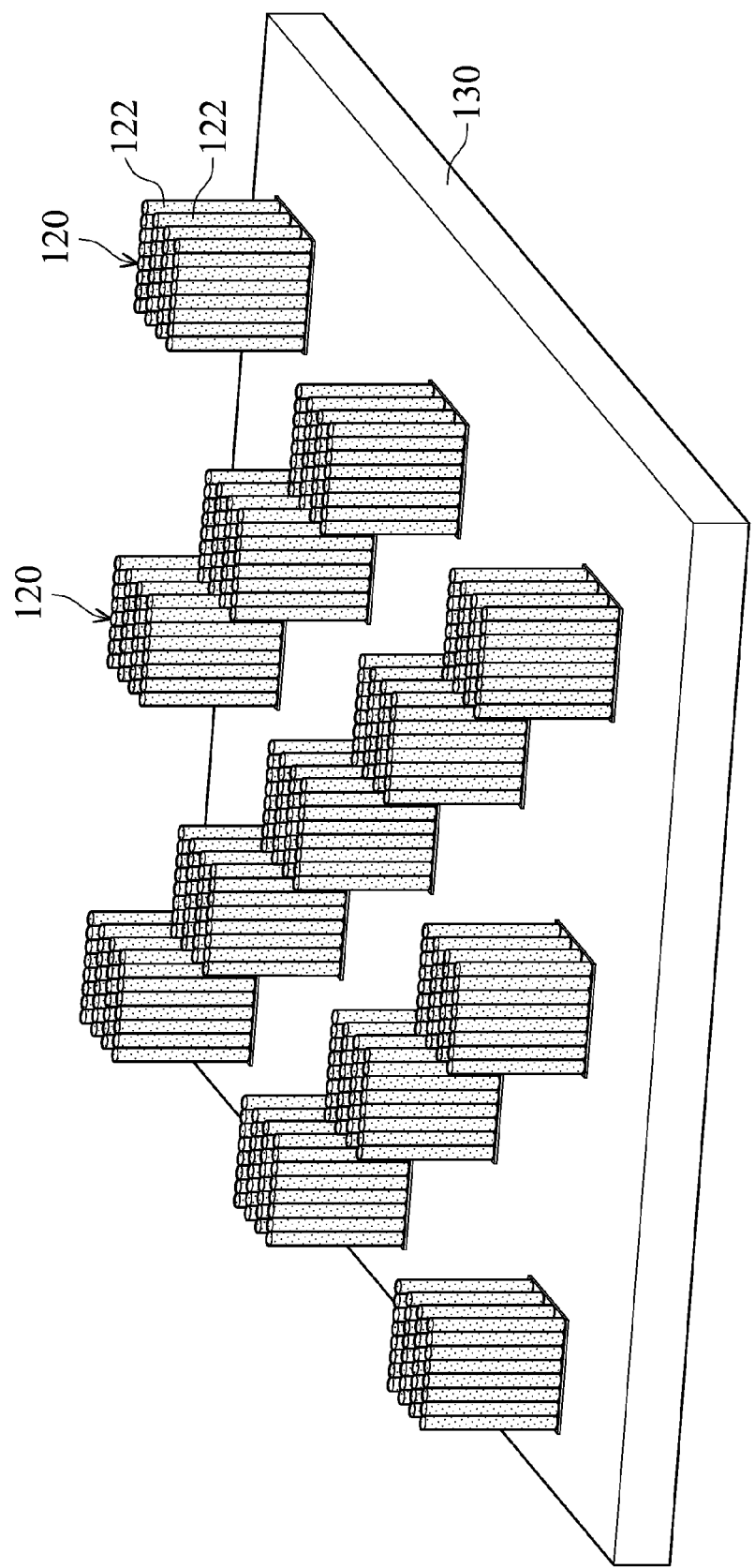
Figure 11C:
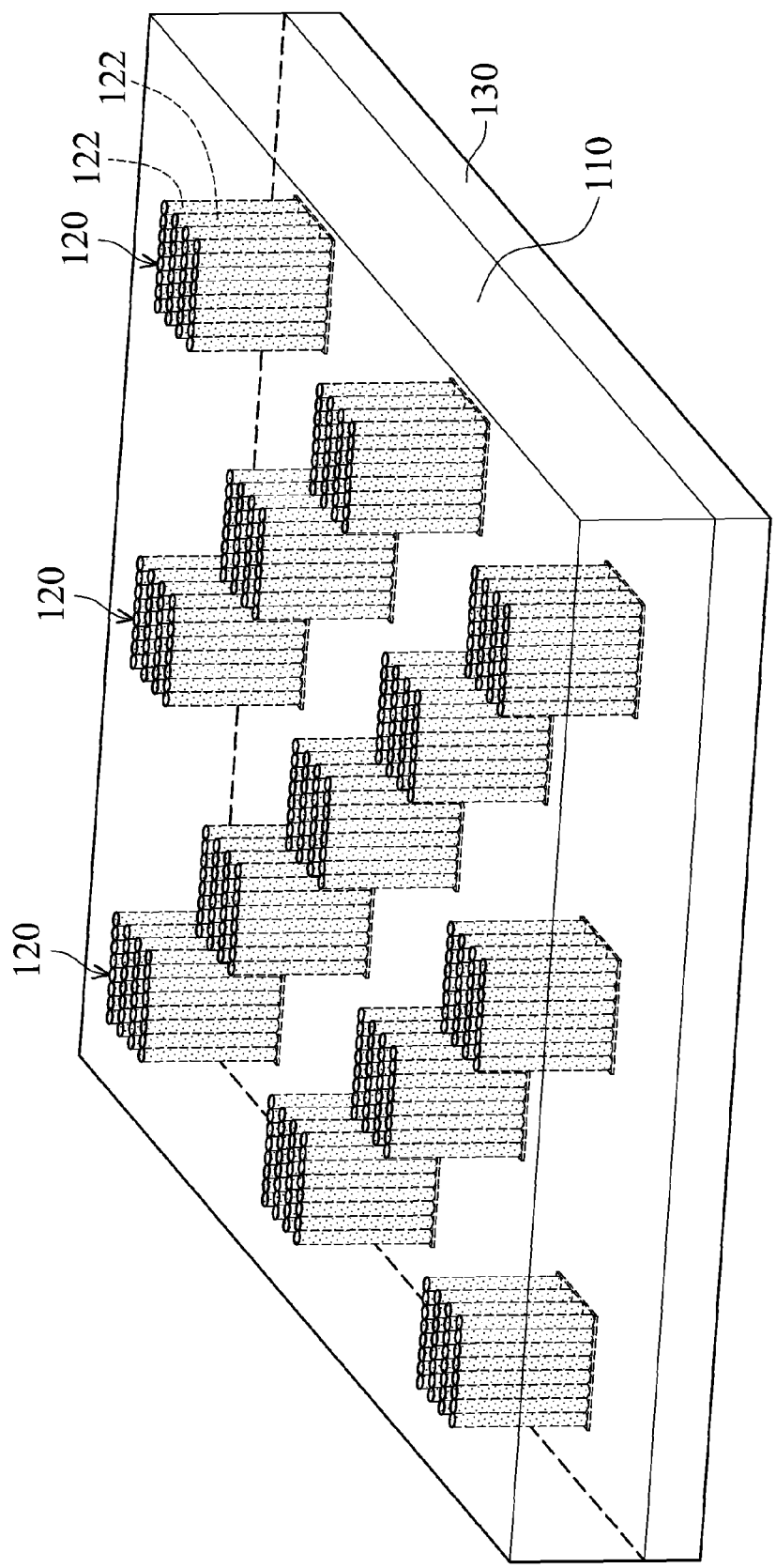

FIGS. 11A-11C are perspective views showing the steps of forming a thermoelectric composite material according to an embodiment of the present disclosure. First, as shown in FIG. 11A, a substrate 130 is provided, and a catalytic film 140 is formed on the substrate 130 by evaporation. The material of the catalytic film 140 may include iron, cobalt, nickel, or another catalysis material suitable for growing carbon nanotubes. The thickness of the catalytic film 140 may be about 1 nm to 20 nm.

Next, as shown in FIGS. 11A and 11B, a thermal-chemical vapor deposition (Thermal-CVD) process may be performed to grow a plurality of carbon nanotubes 122 on the catalytic film 140 to form a plurality of nano-carbon material units 120.

The length of the carbon nanotubes 122 is smaller than about 3 µm, and the diameter thereof is smaller than about 100 nm.

Next, as shown in FIG. 11C, a pulsed laser deposition (PLD) process or a combinatorial chemical vapor deposition process may be performed to deposit nano-thermoelectric particles between the nano-carbon material units 120, thus forming a two-dimensional film type thermoelectric matrix 110. Because many boundaries exist between the nano-thermoelectric particle and the carbon nanotubes 122, transmission of phonon in the thermoelectric matrix 110 may be significantly obstructed, thus further decreasing the thermal conductivity ($\kappa$). In addition, the vertical array structure of the carbon nanotubes 122 and the excellent physical properties of the carbon nanotubes 122 may cause the Seebeck coefficient ($\alpha$) and the conductivity ($\sigma$) to be significantly increased.

Figure 12A:
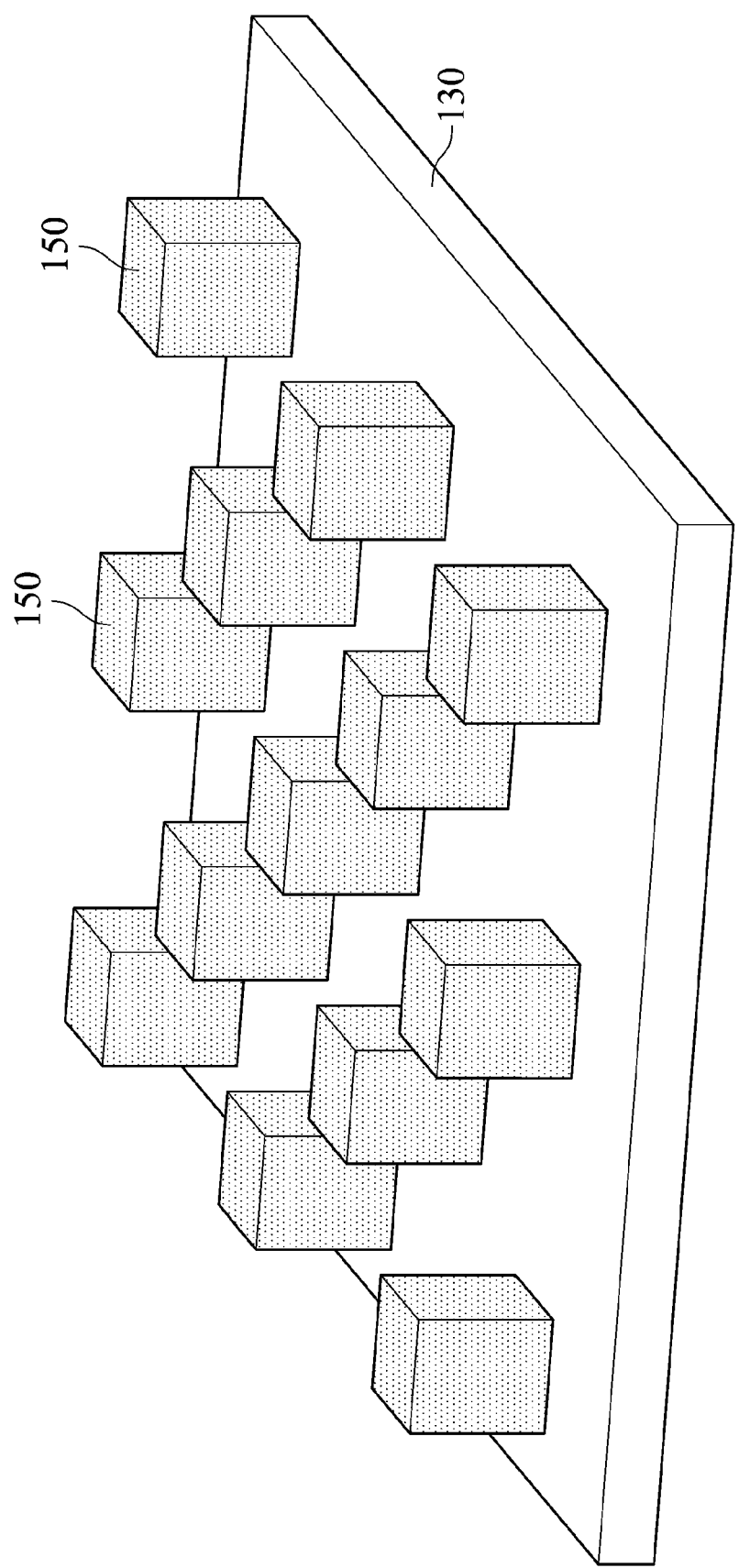
FIGS. 12A-12D are perspective views showing the steps of forming a thermoelectric composite material according to another embodiment of the present disclosure.
Figure 12B:
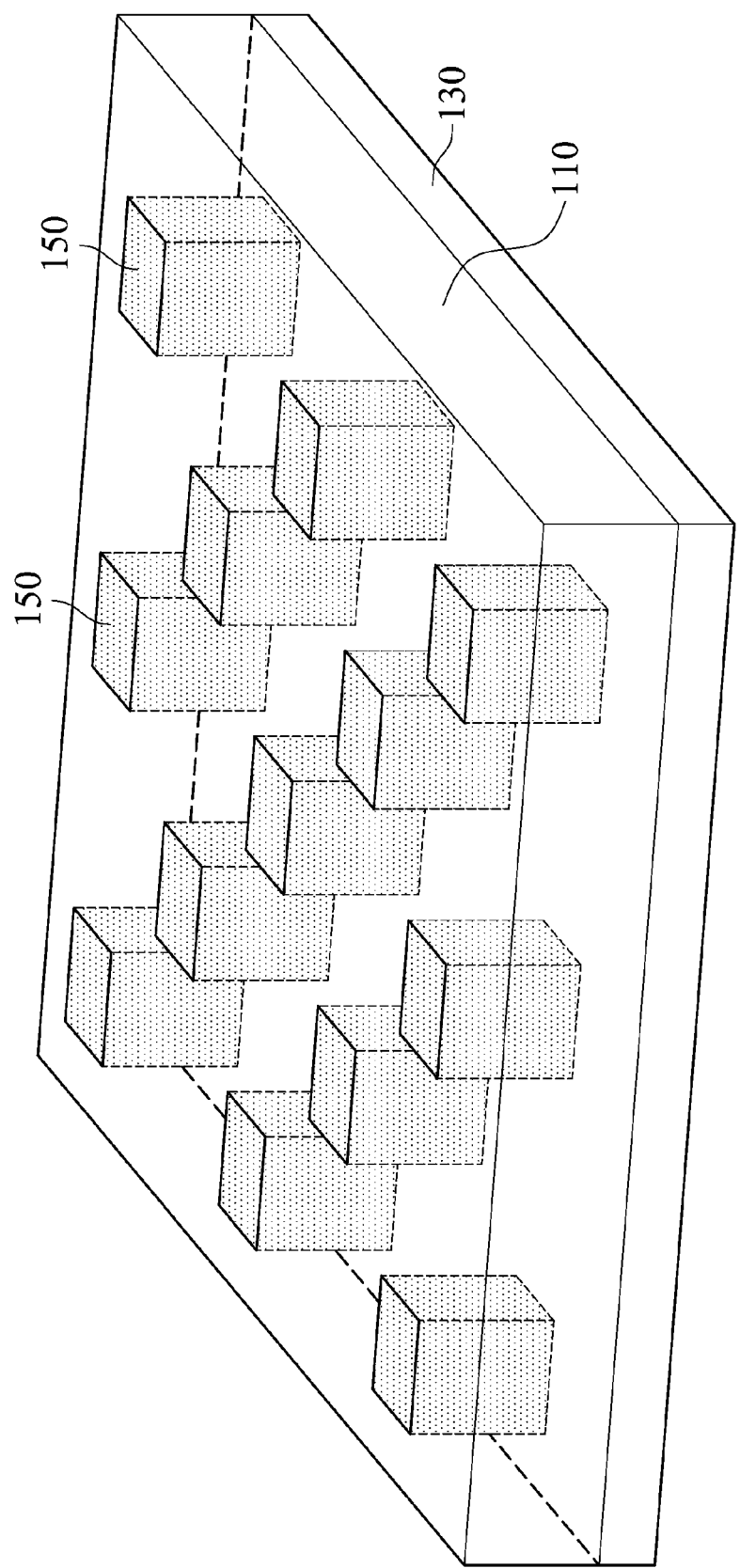

FIGS. 12A-12D are perspective views showing the steps of forming a thermoelectric composite material according to another embodiment of the present disclosure. First, as shown in FIG. 12A, a substrate 130 is provided, and an electroforming process is performed to form a plurality of nickel posts 150 arranged like a checker board on the substrate 130, wherein the height of the nickel post 150 is about 300 µm. Next, as shown in FIG. 12B, a pulsed laser deposition process or a combined chemical vapor deposition process may be performed to deposit nano-thermoelectric particles between the nickel posts 150, thus forming a two-dimensional film type thermoelectric matrix 110.

Figure 12C:
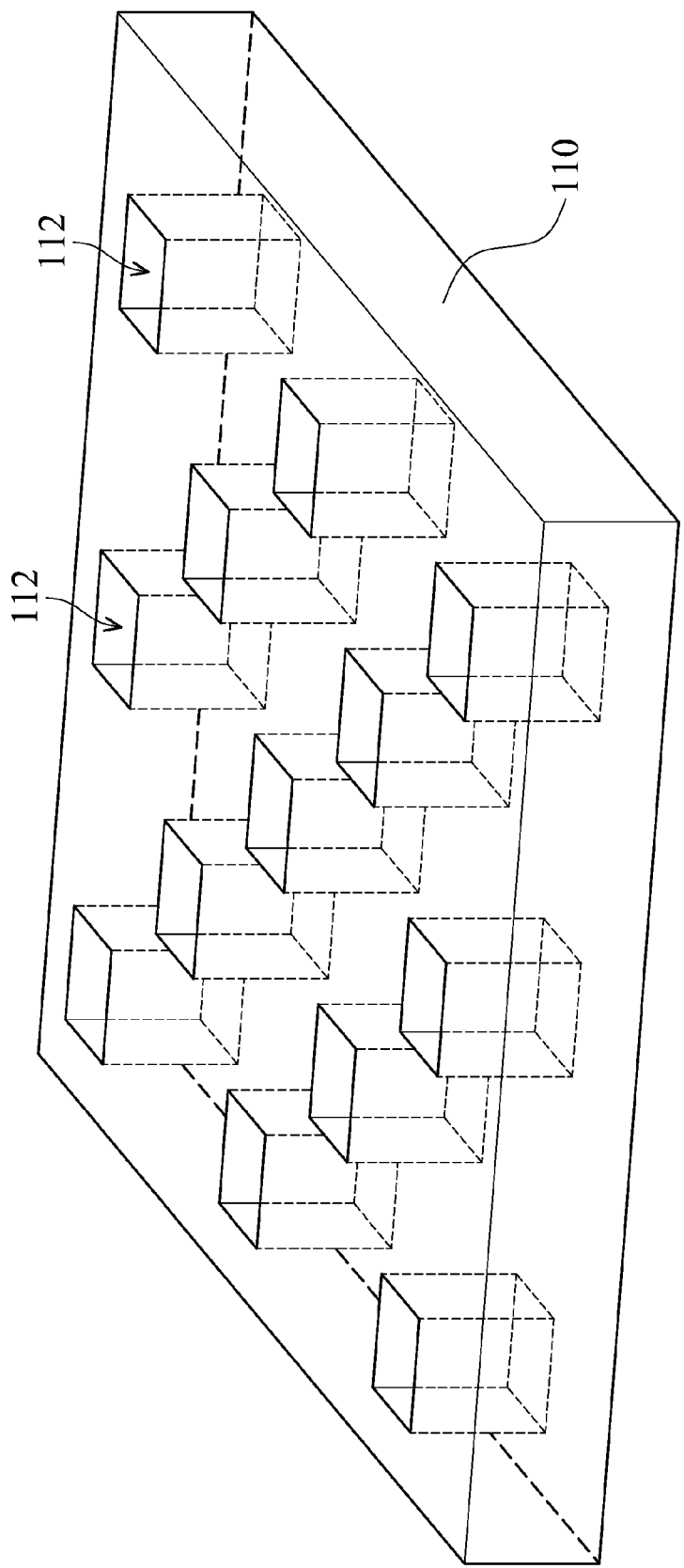
Figure 12D:
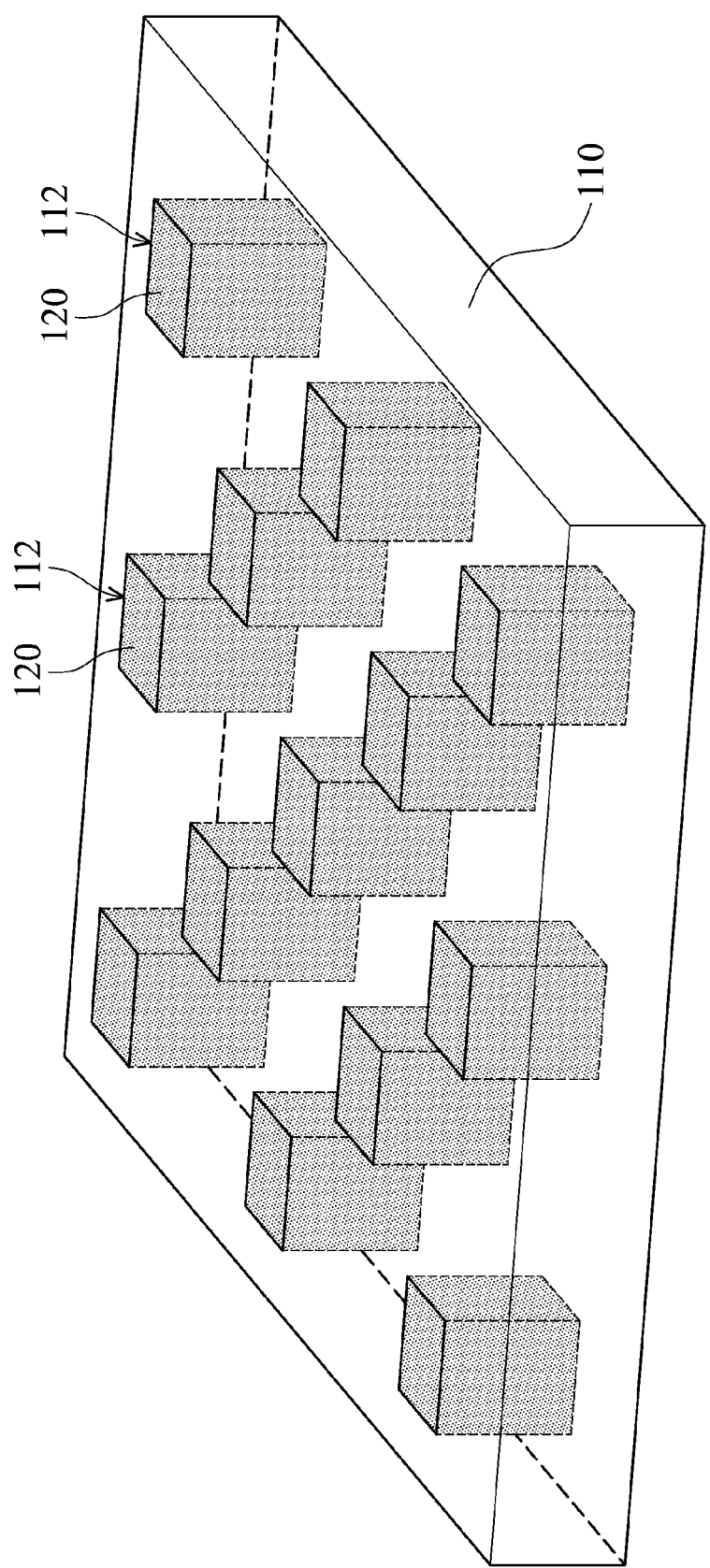

Next, as shown in FIG. 12C, a peel mode process is performed to remove the substrate 130 and the nickel posts 150 thereon, thus leaving a plurality of through-holes 112 in the thermoelectric matrix 110. Next, as shown in FIG. 12D, a plurality of carbon nanotubes (not shown) is filled into the through-holes 112 to form a plurality of nano-carbon material units 120. The step of filling the carbon nanotubes into the through-holes 112 may be performed by, for example, dropping the carbon nanotubes into the through-holes 112.

Thereafter, fabrication methods for thermoelectric composite materials according to two Examples of the disclosure and physical property diagrams of the two Examples and two Comparative Examples are illustrated.

The thermoelectric matrix of the thermoelectric composite material of Example 1 included bismuth telluride ($Bi_2Te_3$), and a plurality of nano-carbon material units were located in the thermoelectric matrix. The fabrication method for the thermoelectric composite material of Example 1 is illustrated below.

First, as shown in FIG. 11A, a silicon oxide layer with a thickness of 600 nm was formed on a silicon substrate. Then, a catalytic film 140 having a plurality of island structures A was formed on the silicon oxide layer by using a plasma evaporation process. Both the length L and the width W of the island structure A were 500 nm, and the spacing D between neighboring island structures A was 500 nm. The island structure A had an aluminum layer with a thickness of 10 nm and an iron layer with a thickness of 1 nm. It should be appreciated that the drawings are not drawn to scale and are shown for illustrative purpose only.

Figure 13:
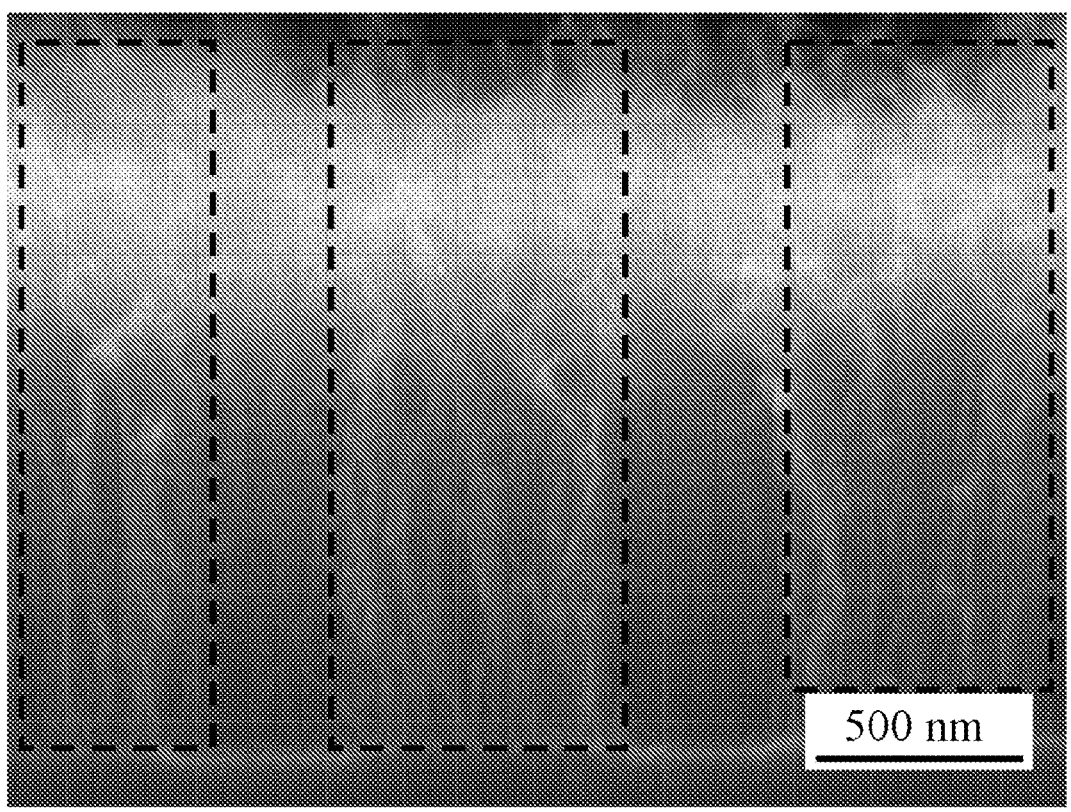
FIG. 13 is an SEI image showing the carbon nanotubes arranged in an array according to Example 1 of the disclosure.

Next, as shown in FIG. 11B, a thermal chemical vapor deposition process was performed to grow carbon nanotubes on the island structures A. During the growth process, a gas mixture of acetylene ($C_2H_2$) (flow 60 sccm)/hydrogen (flow 10 sccm) was adopted to grow the carbon nanotubes for 10 minutes, wherein the process temperature was about 800° C. FIG. 13 is an SEI image showing the carbon nanotubes arranged in an array according to Example 1 of the disclosure. Referring to FIG. 13, the dashed frames indicate a plurality of carbon nanotubes located on each of the island structures. It can be observed from FIG. 13 that the height of the carbon nanotube was smaller than about 3 µm, and an average diameter of the carbon nanotubes was about 20 nm. Then, as shown in FIG. 11C, a pulse laser process or a plasma enhanced chemical vapor deposition (PECVD) process was performed to grow bismuth telluride (the thermoelectric matrix 110).

The thermoelectric composite material of Comparative Example 1 only had a thermoelectric matrix including bismuth telluride ($Bi_2Te_3$) and had no nano-carbon material unit. The fabrication method for the thermoelectric composite material of Comparative Example 1 is illustrated below. A silicon oxide layer with a thickness of 600 nm was formed on a silicon substrate. Then, a laser pulse process or a plasma enhanced chemical vapor deposition process was performed to grow bismuth telluride (the thermoelectric matrix 110).

The thermoelectric matrix of the thermoelectric composite material of Example 2 included antimony-doped bismuth telluride ($Bi_{0.4}Sb_{1.6}Te_3$), and a plurality of nano-carbon material units were located in the thermoelectric matrix. The fabrication method for the thermoelectric composite material of Example 2 was similar to that of Example 1, except that in Example 2, a pulse laser process or a plasma enhanced chemical vapor deposition process was performed to grow antimony-doped bismuth telluride (the thermoelectric matrix 110). The 3$\omega$ method was applied to detect the thermoelectric composite material of Example 2, and the thermoelectric composite material of Example 2 had a thermal conductivity ($\kappa$) of 0.68 W/mK.

The thermoelectric composite material of Comparative Example 2 only had a thermoelectric matrix including antimony-doped bismuth telluride and had no nano-carbon material unit. The fabrication method for the thermoelectric composite material of Comparative Example 2 was similar to that of Comparative Example 1 mentioned above, except that in Comparative Example 2, a pulse laser process or a plasma enhanced chemical vapor deposition process was performed to grow antimony-doped bismuth telluride (the thermoelectric matrix 110). The 3$\omega$ method was applied to detect the thermoelectric composite material of Comparative Example 2, and the thermoelectric composite material of Comparative Example 2 had a thermal conductivity ($\kappa$) of 0.75 W/mK which was higher than the thermal conductivity of Example 2. It is possible that transmission of phonon in the thermoelectric composite material of Example 2 was obstructed such that the thermal conductivity of the thermoelectric composite material was reduced.

Figure 14:
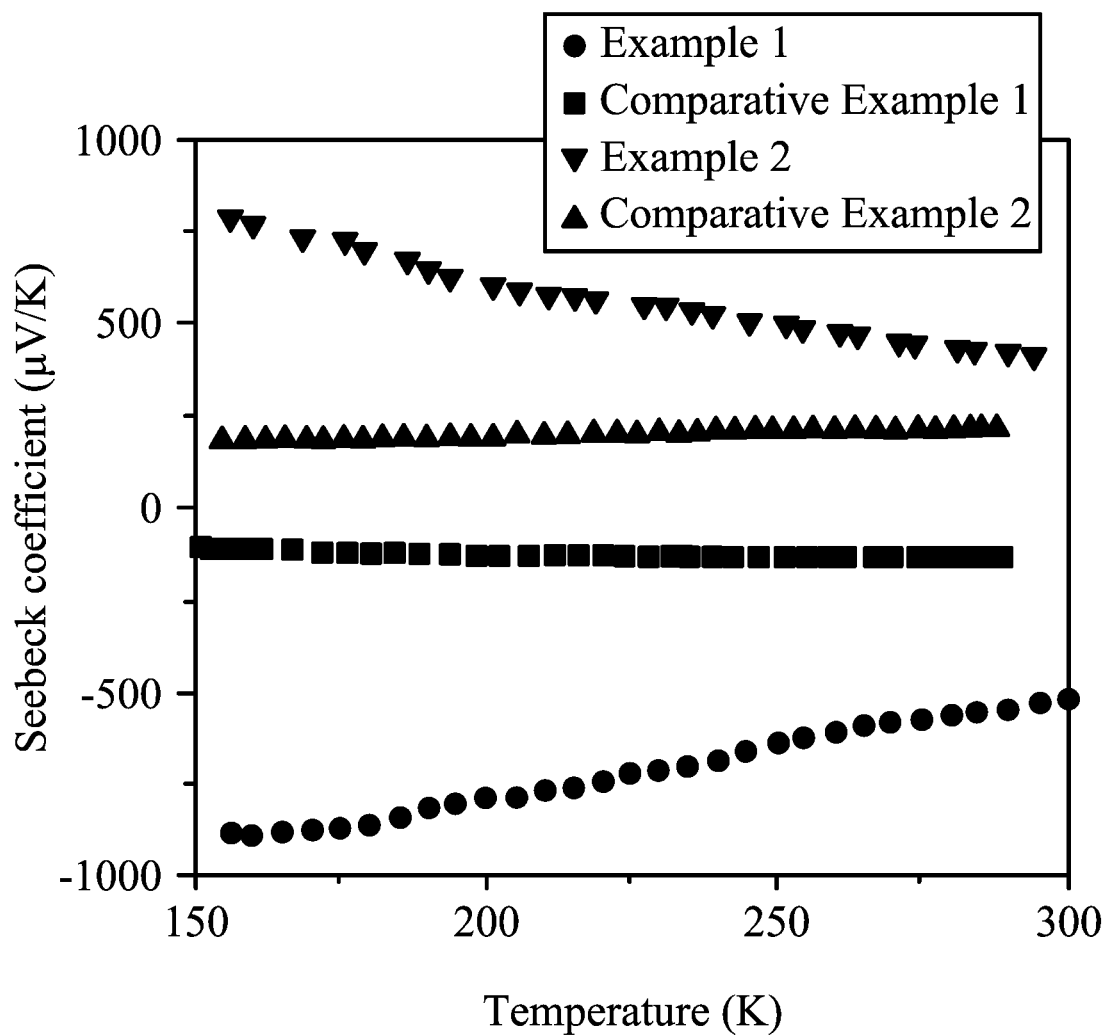
FIG. 14 shows Seebeck coefficients of thermoelectric composite materials of Example 1, Comparative Example 1, Example 2, and Comparative Example 2 at different temperatures.

FIG. 14 shows Seebeck coefficients of thermoelectric composite materials of Example 1, Comparative Example 1, Example 2, and Comparative Example 2 at different temperatures. Referring to FIG. 14, because antimony-doped bismuth telluride is a P type thermoelectric material, the Seebeck coefficients of Example 2 and Comparative Example 2, which use antimony-doped bismuth telluride as the thermoelectric matrix, were positive. On the contrary, because bismuth telluride is an N type thermoelectric material, the Seebeck coefficients of Example 1 and Comparative Example 1, which use bismuth telluride as the thermoelectric matrix, were negative. Thus, for convenience, only absolute values of the Seebeck coefficients are considered (i.e., without regard to its positive or negative sign) in the following description.

As shown in FIG. 14, the Seebeck coefficient of Example 1 having carbon nanotubes was larger than the Seebeck coefficient of Comparative Example 1 having no carbon nanotube. The Seebeck coefficient of Example 2 having carbon nanotubes was larger than the Seebeck coefficient of Comparative Example 2 having no carbon nanotube. Therefore, introducing carbon nanotubes in the thermoelectric matrix may significantly increase the Seebeck coefficient.

Figure 15:
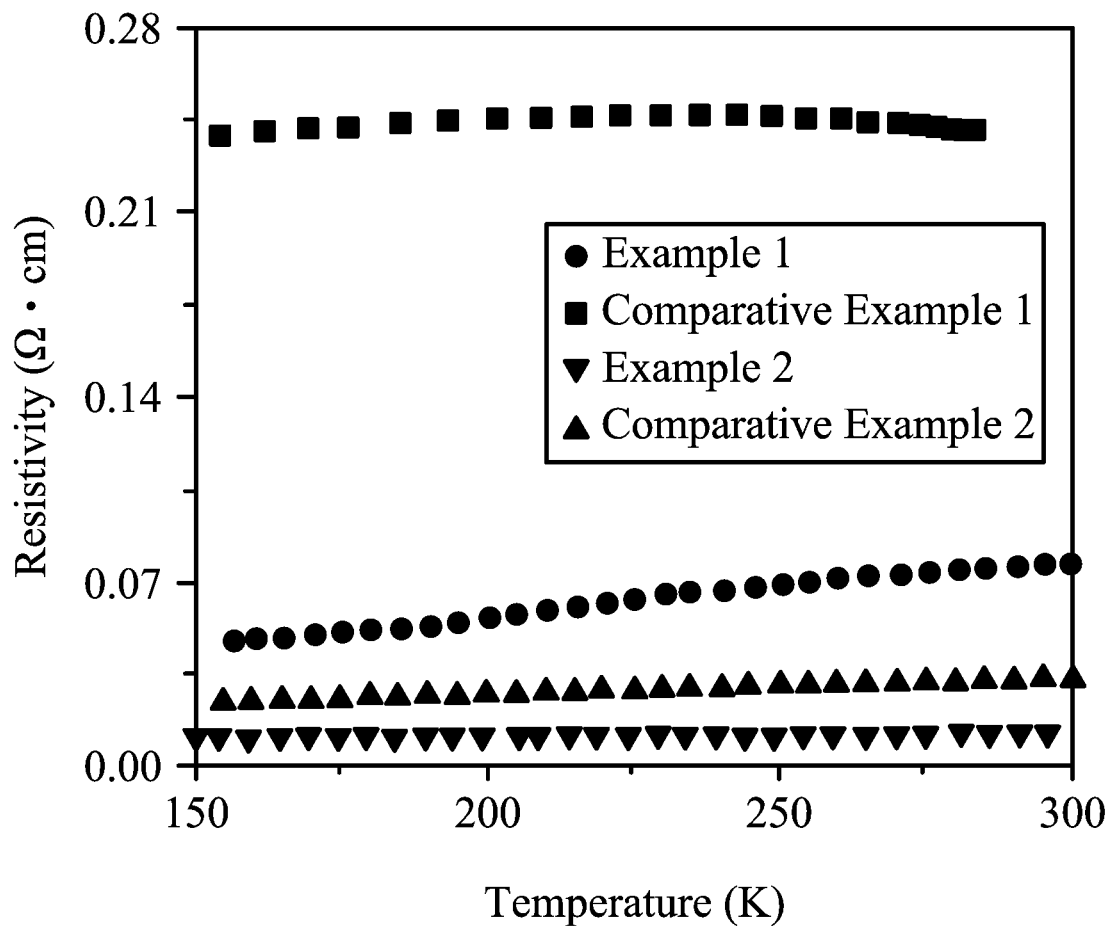
FIG. 15 shows resistivities of thermoelectric composite materials of Example 1, Comparative Example 1, Example 2, and Comparative Example 2 at different temperatures.

FIG. 15 shows resistivities of thermoelectric composite materials of Example 1, Comparative Example 1, Example 2, and Comparative Example 2 at different temperatures. As shown in FIG. 15, the resistivity of Example 1 having carbon nanotubes was smaller than the resistivity of Comparative Example 1 having no carbon nanotube. The resistivity of Example 2 having carbon nanotubes was smaller than the resistivity of Comparative Example 2 having no carbon nanotube. Therefore, introducing carbon nanotubes in the thermoelectric matrix may significantly decrease the resistivity.

Figure 16:
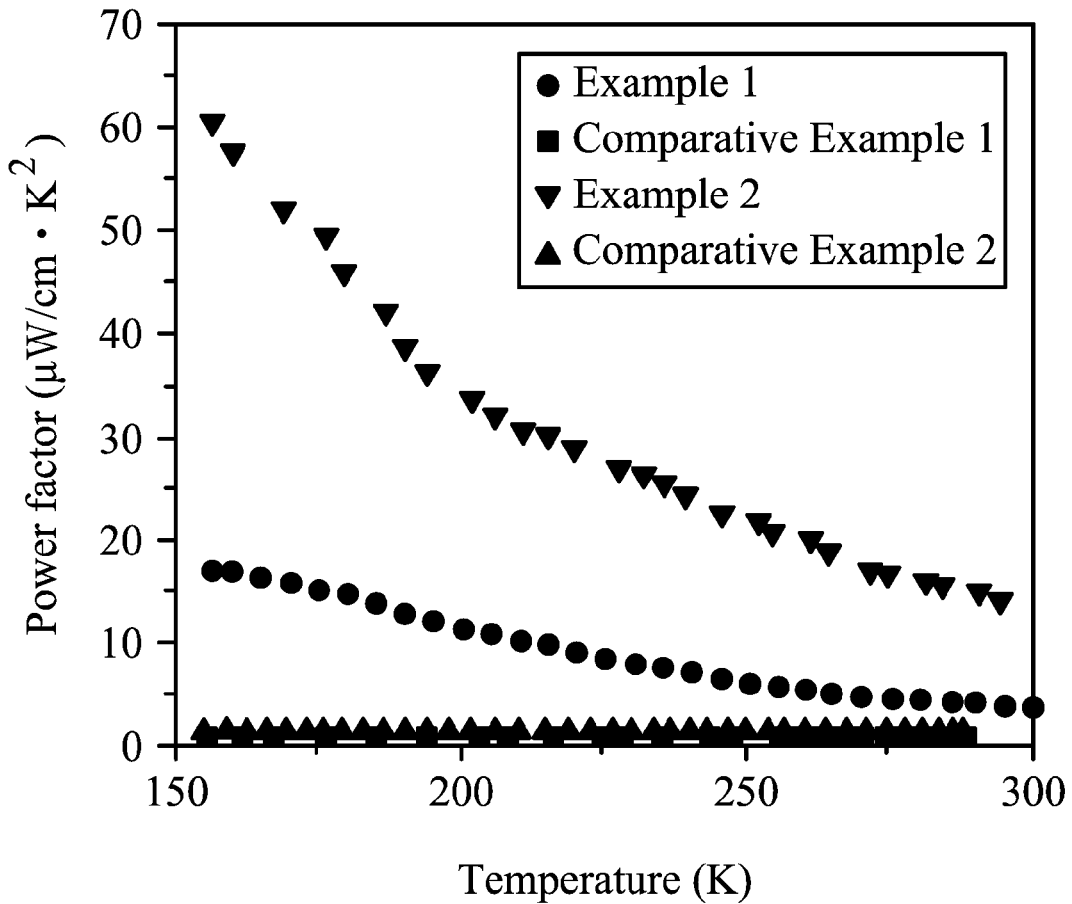
FIG. 16 shows power factors of thermoelectric composite materials of Example 1, Comparative Example 1, Example 2, and Comparative Example 2 at different temperatures.

FIG. 16 shows power factors of thermoelectric composite materials of Example 1, Comparative Example 1, Example 2, and Comparative Example 2 at different temperatures. As shown in FIG. 16, the power factor of Example 1 having carbon nanotubes was larger than the power factor of Comparative Example 1 having no carbon nanotube. The power factor of Example 2 having carbon nanotubes was smaller than the power factor of Comparative Example 2 having no carbon nanotube. Therefore, introducing carbon nanotubes in the thermoelectric matrix may significantly increase the power factor.

In light of the foregoing, in the embodiments of the disclosure, the nano-carbon material units are spaced apart from each other in the thermoelectric matrix to effectively obstruct phonon transmission in the thermoelectric matrix. Thus, the thermal conductivity of the thermoelectric composite material is further reduced and the ZT value is increased. Further, because the nano-carbon material units are spaced apart from each other in the thermoelectric matrix and has a nanostructure array, the Seebeck coefficient (a) of the thermoelectric composite material may be effectively increased. The nano-carbon material units have excellent physical properties (such as good conductivity) such that the ZT value of the thermoelectric composite material is significantly increased.

While the disclosure has been described by way of example and in terms of the preferred embodiments, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A thermoelectric composite material, comprising:
   a thermoelectric matrix comprising a thermoelectric material; and
   a plurality of nano-carbon material units located in the thermoelectric matrix and spaced apart from each other, wherein a spacing between two neighboring nano-carbon material units of the nano-carbon material units is about 50 nm to 2 µm, each of the nano-carbon material units comprises a plurality of carbon nanotubes, and the nano-carbon material units are in columnar shapes.

2. The thermoelectric composite material as claimed in claim 1, wherein the spacing is about 200 nm to 1 µm.

3. The thermoelectric composite material as claimed in claim 2, wherein the spacing is about 400 nm to 700 nm.

4. The thermoelectric composite material as claimed in claim 1, wherein the thermoelectric material comprises bismuth telluride, antimony-doped bismuth telluride, selenium-doped bismuth telluride, zinc antimonide, half-Heusler alloys, or combinations thereof.

5. The thermoelectric composite material as claimed in claim 1, wherein the nano-carbon material units comprises carbon nanotubes, graphite, or graphene.

6. The thermoelectric composite material as claimed in claim 1, wherein the nano-carbon material units are embedded in the thermoelectric matrix along a single direction.

7. The thermoelectric composite material as claimed in claim 1, wherein the nano-carbon material units are embedded in the thermoelectric matrix along different directions respectively.

8. The thermoelectric composite material as claimed in claim 1, wherein the nano-carbon material units are arranged in a one-dimensional array, a two-dimensional array, or a random manner in the thermoelectric matrix.

9. The thermoelectric composite material as claimed in claim 8, wherein the nano-carbon material units arranged in a same row are arranged at equal intervals.

10. The thermoelectric composite material as claimed in claim 8, wherein the nano-carbon material units arranged in a same row are arranged at different intervals.

11. The thermoelectric composite material as claimed in claim 1, wherein the thermoelectric composite material has a main surface, and the cross-sectional shapes of the nano-carbon material units along the main surface comprise a square shape, a circular shape, an elliptic shape, a hexagonal shape, or a polygonal shape other than the square shape or the hexagonal shape.

12. The thermoelectric composite material as claimed in claim 1, further comprising:
    a substrate, wherein the thermoelectric matrix is disposed on the substrate and is insulated from the substrate.

13. The thermoelectric composite material as claimed in claim 1, wherein each of the nano-carbon material units has a width about 100 nm to 1 µm.

14. The thermoelectric composite material as claimed in claim 1, wherein each of the nano-carbon material units has a width substantially equal to the spacing.

15. The thermoelectric composite material as claimed in claim 1, wherein the nano-carbon material units penetrate through the thermoelectric matrix.

* * * * *